(12) United States Patent
Harjung et al.

(10) Patent No.: US 10,867,981 B2
(45) Date of Patent: Dec. 15, 2020

(54) HIGH FREQUENCY INTEGRATED CIRCUIT AND EMITTING DEVICE FOR IRRADIATING THE INTEGRATED CIRCUIT

(71) Applicant: Advantest Corporation, Tokyo (JP)

(72) Inventors: Rolf Harjung, Holzgerlingen (DE); Peter Rohmann, Stuttgart (DE)

(73) Assignee: ADVANTEST CORPORATION, Tokyo (JP)

( * ) Notice: Subject to any disclaimer, the term of this patent is extended or adjusted under 35 U.S.C. 154(b) by 207 days.

(21) Appl. No.: 15/835,156

(22) Filed: Dec. 7, 2017

(65) Prior Publication Data

US 2018/0108641 A1 Apr. 19, 2018

Related U.S. Application Data

(63) Continuation of application No. PCT/EP2015/062873, filed on Jun. 10, 2015.

(51) Int. Cl.

| | |
|---|---|
| *H01L 25/16* | (2006.01) |
| *H03B 17/00* | (2006.01) |
| *H01Q 1/22* | (2006.01) |
| *H03B 28/00* | (2006.01) |
| *H01L 27/06* | (2006.01) |
| *H03B 1/04* | (2006.01) |

(52) U.S. Cl.
CPC ........ *H01L 25/167* (2013.01); *H01L 27/0605* (2013.01); *H01Q 1/22* (2013.01); *H03B 1/04* (2013.01); *H03B 17/00* (2013.01); *H03B 28/00* (2013.01)

(58) Field of Classification Search
CPC .... H04B 10/40; G01J 5/00; G01J 3/42; H01L 25/167; H01L 27/0605; H01L 31/16; G01D 5/00; G02B 5/208; G02B 5/223; G01S 7/4818; H03B 1/04; H03B 17/00; H03B 28/00; H01Q 1/22
USPC .... 250/370.01, 372, 338.1, 365, 206, 492.2; 331/108 C See application file for complete search history.

(56) References Cited

U.S. PATENT DOCUMENTS

| | | |
|---|---|---|
| 3,304,429 A | 2/1967 | Bonin et al. |
| 5,157,323 A | 10/1992 | Ali et al. |
| 5,347,235 A | 9/1994 | Higgins et al. |

(Continued)

FOREIGN PATENT DOCUMENTS

| | | |
|---|---|---|
| EP | 0626588 | 11/1994 |
| EP | 0984291 | 3/2000 |

(Continued)

OTHER PUBLICATIONS

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

(Continued)

*Primary Examiner* — Arnold M Kinkead

(57) ABSTRACT

What is described is a high-frequency integrated circuit provided on a III-V compound semiconductor, wherein an emitting device is radiation-coupled with the integrated circuit such that the emitting device irradiates the integrated circuit, and wherein the integrated circuit has at least one of an oscillator, a mixer, a phase shifter, a frequency divider or an amplifier.

17 Claims, 14 Drawing Sheets

(56) References Cited

U.S. PATENT DOCUMENTS

| | | | |
|---|---|---|---|
| 5,623,233 | A | 4/1997 | Higgins et al. |
| 5,808,322 | A | 9/1998 | Nicholson et al. |
| 6,327,545 | B1 | 12/2001 | Browen et al. |
| 6,397,160 | B1 | 5/2002 | Craig et al. |
| 6,795,496 | B1 | 9/2004 | Soma et al. |
| 7,208,888 | B2 | 4/2007 | Lovato et al. |
| 7,256,585 | B1 | 8/2007 | Shoulders |
| 7,498,552 | B2 | 3/2009 | Kraemer |
| 7,750,753 | B1 | 7/2010 | Cadotte, Jr. et al. |
| 7,847,301 | B2 | 12/2010 | Ives et al. |
| 8,796,801 | B2 | 8/2014 | Kraemer |
| 2004/0004466 | A1 | 1/2004 | Miyanaga et al. |
| 2004/0036462 | A1 | 2/2004 | Evers et al. |
| 2005/0050546 | A1 | 3/2005 | Remany et al. |
| 2005/0068068 | A1 | 3/2005 | Hall |
| 2005/0234662 | A1 | 10/2005 | Niedzwiecki et al. |
| 2009/0092177 | A1 | 4/2009 | Dvorak et al. |
| 2009/0129129 | A1 | 5/2009 | Udagawa |
| 2009/0272634 | A1 | 11/2009 | Ehlers et al. |
| 2010/0225301 | A1 | 9/2010 | Nakayama et al. |
| 2010/0228515 | A1 | 9/2010 | Srinivasan et al. |
| 2010/0309952 | A1 | 12/2010 | Asami |
| 2010/0312506 | A1 | 12/2010 | Taylor |
| 2011/0121181 | A1* | 5/2011 | Costello ............... G01S 7/4813 250/338.1 |
| 2011/0227767 | A1 | 9/2011 | O'Brien |
| 2012/0049655 | A1 | 3/2012 | Leyendecker et al. |
| 2012/0221279 | A1 | 8/2012 | Zhang |
| 2013/0006567 | A1 | 1/2013 | Horn |
| 2013/0229068 | A1 | 9/2013 | Sanders, III et al. |
| 2013/0234723 | A1 | 9/2013 | Behrens et al. |

FOREIGN PATENT DOCUMENTS

| | | | |
|---|---|---|---|
| EP | 1298778 | | 4/2003 |
| JP | H11038087 | | 2/1999 |
| JP | 2000009792 | | 1/2000 |
| WO | 99/21025 | | 4/1999 |
| WO | 2012/084028 | | 6/2012 |
| WO | 2014/135194 | | 9/2014 |
| WO | WO2015/030673 | * | 5/2015 |

OTHER PUBLICATIONS

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

Bhasin, K. B. et al., "Optically Controlled Microwave Devices and Circuits: Emerging Applications in Space Communications Systems," NASA Technical Memorandum, TM-89869, Jul. 27, 1987, pp. 1-11.

\* cited by examiner

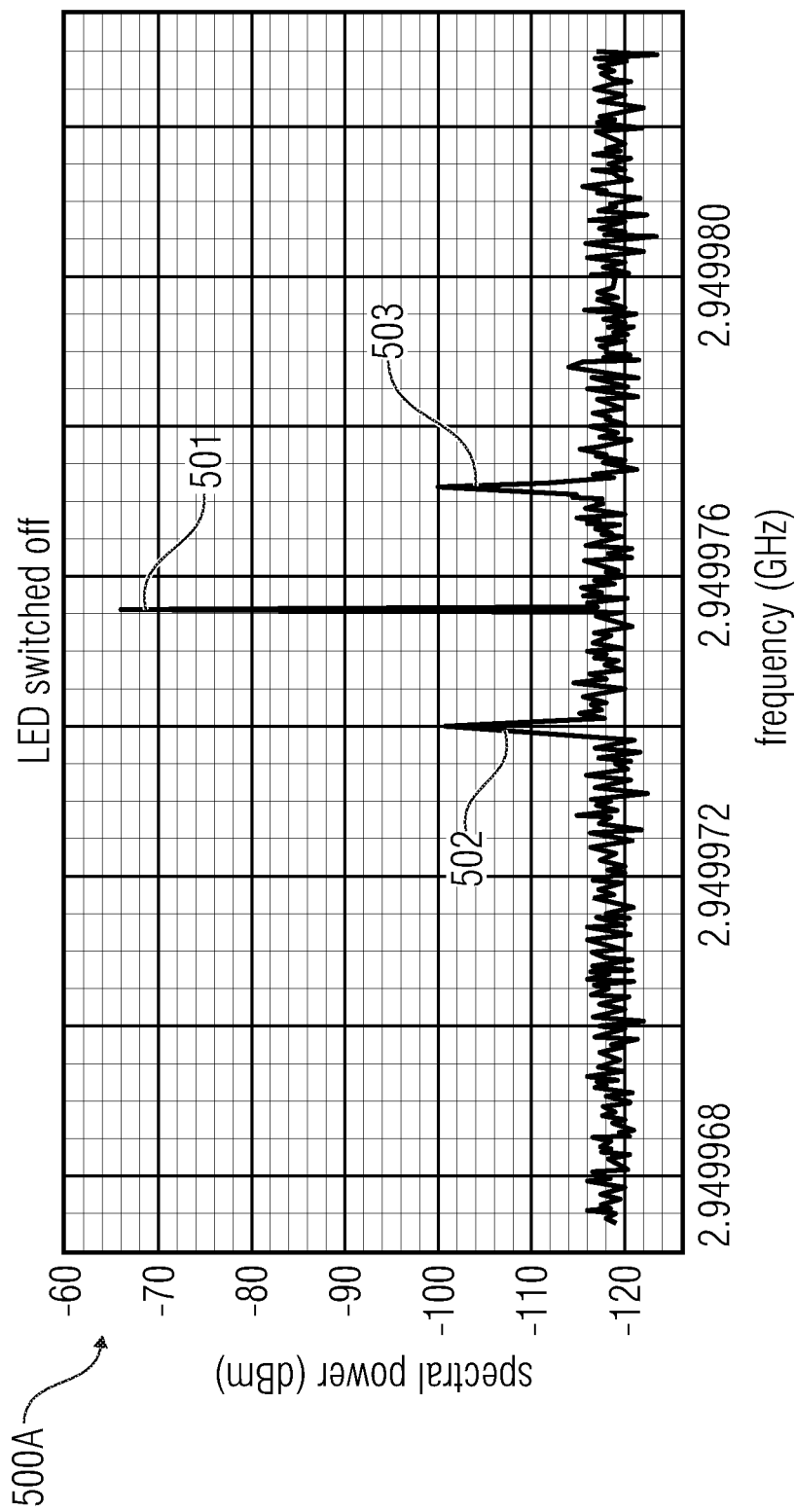

HIGH FREQUENCY INTEGRATED CIRCUIT AND EMITTING DEVICE FOR IRRADIATING THE INTEGRATED CIRCUIT

CROSS-REFERENCE TO RELATED APPLICATION

This application is a continuation of copending International Application No. PCT/EP2015/062873, filed Jun. 10, 2015, which is incorporated herein by reference in its entirety.

BACKGROUND OF THE INVENTION

Embodiments of the present invention relate to a high-frequency electronic component, a high-frequency integrated circuit, a method for operating a high-frequency electronic component, and a method for operating a high-frequency integrated circuit.

Electronic components may comprise integrated circuits being provided on semiconductor chips. In particular compound semiconductors such as, for instance, semiconductors manufactured using a III-V-technology, are able to generate effects with a remarkably large time-constant. However, at the same time these semiconductors may show a slow transient response, long settling times for static states and unwanted low-frequency oscillations.

For a highly performant design of such compound semiconductors countermeasures need to be taken to avoid, or at least to suppress or attenuate the occurrence of these effects.

Thus, it is desirable to improve existing electronic components and integrated circuits.

SUMMARY

According to an embodiment, a high-frequency electronic component may have: a compound semiconductor chip having an integrated circuit, and a board on which the compound semiconductor chip is arranged, wherein the board has a recess that is configured to receive an emitting device for irradiating the integrated circuit.

Another embodiment may have a high-frequency integrated circuit provided on a III-V compound semiconductor, wherein an emitting device is radiation-coupled with the integrated circuit such that the emitting device irradiates the integrated circuit, and wherein Final version PCT/EP2015/062873 Final Version US the integrated circuit has at least one of an oscillator, a mixer, a phase shifter, a frequency divider or an amplifier.

Another embodiment may have a method for operating a high-frequency electronic component, the high-frequency electronic component having a compound semiconductor chip having an integrated circuit, a board on which the compound semiconductor chip is arranged, and a recess provided in the board, wherein the recess is configured to receive an emitting device, wherein the method has irradiating the integrated circuit with the emitting device.

Another embodiment may have a method for operating a high-frequency integrated circuit having a III-V compound semiconductor, wherein the integrated circuit has at least one of an oscillator, a mixer, a phase shifter, a frequency divider or an amplifier, wherein the method has irradiating the integrated circuit with an emitting device that is radiation-coupled with the integrated circuit.

According to a first aspect, a high-frequency electronic component is provided which comprises a compound semiconductor chip comprising an integrated circuit. The electronic component further comprises a board on which the semiconductor chip is arranged. The board comprises a recess that is configured to receive an emitting device for irradiating the integrated circuit. Thus, the inventive device is configured to irradiate the integrated circuit during operation. As the emitting device is arranged, at least partially, within the recess provided in the board, the emitting device can be securely retained in the board. Furthermore, radiation emitted from the emitting device can be easily directed at the compound semiconductor and at the integrated circuit. Radiation that is received by the integrated circuit reduces the susceptibility of the integrated circuit to large time-constant effects such as, for instance, low-frequency oscillations. As the compound semiconductor and the integrated circuit are irradiated, these large time-constant effects are attenuated such that low-frequency oscillations may be substantially removed from an electronic component. Stated differently, the irradiation of the compound semiconductor and the integrated circuit allows to attenuate and substantially suppress the occurrence of undesired large time-constant effects like low-frequency oscillations.

According to a second aspect, a high-frequency integrated circuit is provided on a III-V compound semiconductor. An emitting device is radiation-coupled with the integrated circuit such that the emitting device irradiates the integrated circuit. The integrated circuit comprises at least one of an oscillator, a mixer, a phase shifter, a frequency divider or an amplifier. The emitting device emits radiation and thus acts as a radiation transmitter. The emitted radiation irradiates the integrated circuit being provided on the III-V compound semiconductor. Thus, the integrated circuit acts as a radiation receiver. Accordingly, the emitting device (transmitter) is radiation-coupled with the integrated circuit (receiver) and irradiates the latter. This irradiation of the integrated circuit has the technical effect that large time-constant effects are attenuated such that, e.g. low-frequency oscillations may be substantially removed. Stated differently, the irradiation of the integrated circuit allows to attenuate and substantially suppress the occurrence of undesired large time-constant effects like low-frequency oscillations.

According to a third aspect, a method for operating a high-frequency electronic component is provided, wherein the high-frequency electronic component comprises a compound semiconductor chip comprising an integrated circuit, a board on which the compound semiconductor chip is arranged and a recess in the board, wherein the recess is configured to receive an emitting device. The method comprises irradiating the integrated circuit with the emitting device. By irradiating the compound semiconductor chip and the integrated circuit according to the inventive concept, large time-constant effects such as, for instance, low-frequency oscillations are attenuated such that low-frequency oscillations may be substantially removed from an electronic component. Stated differently, irradiating the compound semiconductor chip and the integrated circuit according to the inventive concept allows to attenuate and substantially suppress the occurrence of undesired large time-constant effects like low-frequency oscillations.

According to a fourth aspect, a method for operating a high-frequency integrated circuit is provided, wherein the high-frequency integrated circuit comprises a III-V compound semiconductor and wherein the integrated circuit comprises at least one of an oscillator, a mixer, a phase shifter, a frequency divider or an amplifier. The method comprises irradiating the integrated circuit with an emitting device that is radiation-coupled with the integrated circuit. By irradiating the III-V compound semiconductor chip and the integrated circuit according to the inventive concept, large time-constant effects such as, for instance, low-frequency oscillations are attenuated such that low-frequency oscillations may be substantially removed from an electronic component. Stated differently, irradiating the III-V compound semiconductor chip and the integrated circuit according to the inventive concept allows to attenuate and substantially suppress the occurrence of undesired large time-constant effects like low-frequency oscillations.

According to an embodiment, the emitting device is a radiation emitting device that is configured to emit visible light, infra-red light, ultraviolet light, gamma radiation or x-radiation (roentgen radiation).

According to an embodiment, the emitting device is a light emitting device. It is desirable to use a LED (Light Emitting Diode) as the light emitting device, as a LED has a low power consumption and can be easily controlled regarding the emission of various colored light having different wavelengths.

According to an embodiment, the LED emits infra-red light at a wavelength between 780 nm and 1400 nm, advantageously between 840 nm and 860 nm, and more advantageously at a wavelength of 850 nm.

According to a further embodiment, the LED emits red light at a wavelength between 630 nm and 790 nm, advantageously between 640 nm and 660 nm, and more advantageously at a wavelength of 650 nm.

According to still a further embodiment, the LED emits yellow light at a wavelength between 530 nm and 630 nm, advantageously between 580 nm and 600 nm, and more advantageously at a wavelength of 590 nm.

The above mentioned wavelength spectra, i.e. infra-red light, red light and yellow light, are particularly preferable for illuminating the integrated circuit as undesired large time-constant effects such as, for instance, low-frequency oscillations, are substantially removed.

In a further embodiment, the LED emits green light at a wavelength between 480 nm and 580 nm, advantageously between 560 nm and 580 nm, and more advantageously at a wavelength of 574 nm.

In still a further embodiment, the LED emits blue light at a wavelength between 380 nm and 497 nm, advantageously between 458 nm and 478 nm, and more advantageously at a wavelength of 468 nm.

The above mentioned wavelength spectra, i.e. green light and blue light, are preferable for illuminating the integrated circuit as undesired large time-constant effects such as, for instance, low-frequency oscillations, are measurably attenuated. According to the present invention, the irradiation or illumination of the integrated circuit with either green or blue light provides an attenuation of the low-frequency oscillations by up to 70% compared to a non-illuminated circuit.

BRIEF DESCRIPTION OF THE DRAWINGS

In the following, embodiments of the present invention are described in more detail with reference to the figures, in which FIG. 5A shows a frequency spectrum that has been recorded during operation of an inventive device without irradiation.

DETAILED DESCRIPTION OF THE INVENTION

Figure 1A:
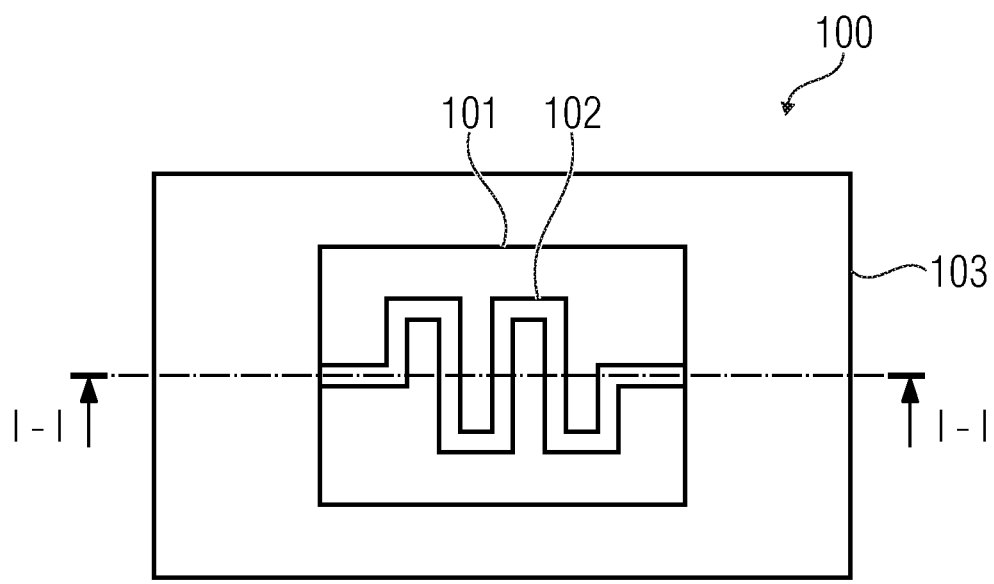
FIG. 1A shows a top view of a high-frequency electronic component according to an embodiment.

Equal or equivalent elements or elements with equal or equivalent functionality are denoted in the following description by equal or equivalent reference numerals.

FIG. 1A shows a top view of a high-frequency electronic component 100 according to an embodiment. The high-frequency electronic component 100 comprises a compound semiconductor chip 101 comprising an integrated circuit 102. The high-frequency electronic component 100 further comprises a board 103 on which the compound semiconductor chip 101 is arranged or mounted.

Figure 1B:
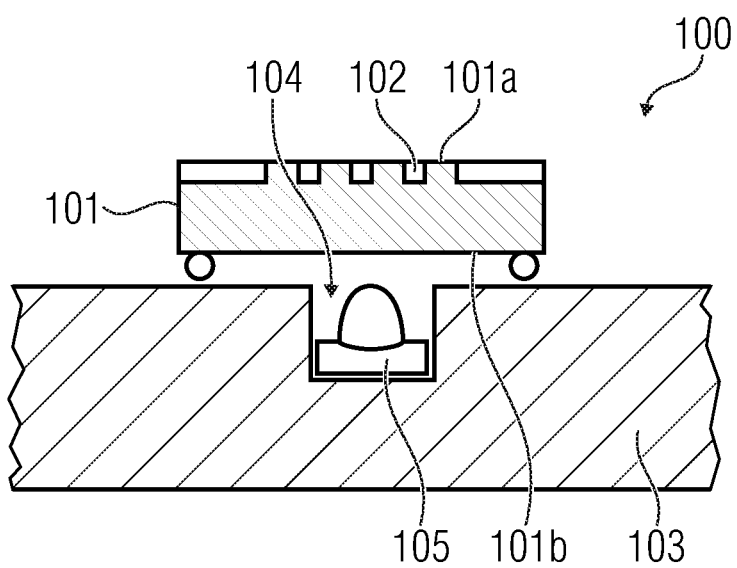
FIG. 1B shows a cross-sectional view of the high-frequency electronic component along the cross-section line I-I shown in FIG. 1A.

FIG. 1B shows the high-frequency electronic component 100 of FIG. 1A in a side cross-sectional view along the line I-I. The board 103 comprises a recess 104 in which an emitting device 105 is provided. The emitting device 105 is configured to irradiate the integrated circuit 102. The emitting device 105 may also be configured to at least partially irradiate the semiconductor chip 101.

As can be seen, the integrated circuit 102 is provided on a side 101a of the compound semiconductor chip 101 facing away from the board 103. Thus, radiation emitted from the emitting device 105 may at least partially penetrate the compound semiconductor chip 101. Additionally or alternatively, the integrated circuit 102 may be provided on a side 101b of the semiconductor chip 101 facing towards the board 103.

The compound semiconductor chip 101 comprises a III-V semiconductor. These compound semiconductors comprise at least one of the chemical group III elements such as, for instance, boron, aluminum, gallium and indium, and at least one of the chemical group V elements such as, for instance, nitrogen, phosphorus, arsenic, antimony and bismuth. These elements can form binary, ternary or quaternary alloys. In an embodiment, the compound semiconductor chip 101 comprises Gallium Arsenide. In an alternative embodiment, the compound semiconductor chip 101 comprises Indium Phosphide or Gallium Nitride.

The integrated circuit 102 is a Monolithic Microwave Integrated Circuit (MMIC). The MMIC is an integrated circuit that operates at high frequencies, i.e. at microwave frequencies or RF frequencies. The MMIC is operated at frequencies between 100 MHz and 300 GHz. In a preferred embodiment, the MMIC is operated at frequencies between 1 GHz and 6 GHz, and more advantageously between 2.3 GHz and 5.1 GHz.

In an embodiment, the integrated circuit 102 comprises at least one of a frequency mixer, a phase shifter, an oscillator, a frequency divider or an amplifier.

Figure 2A:
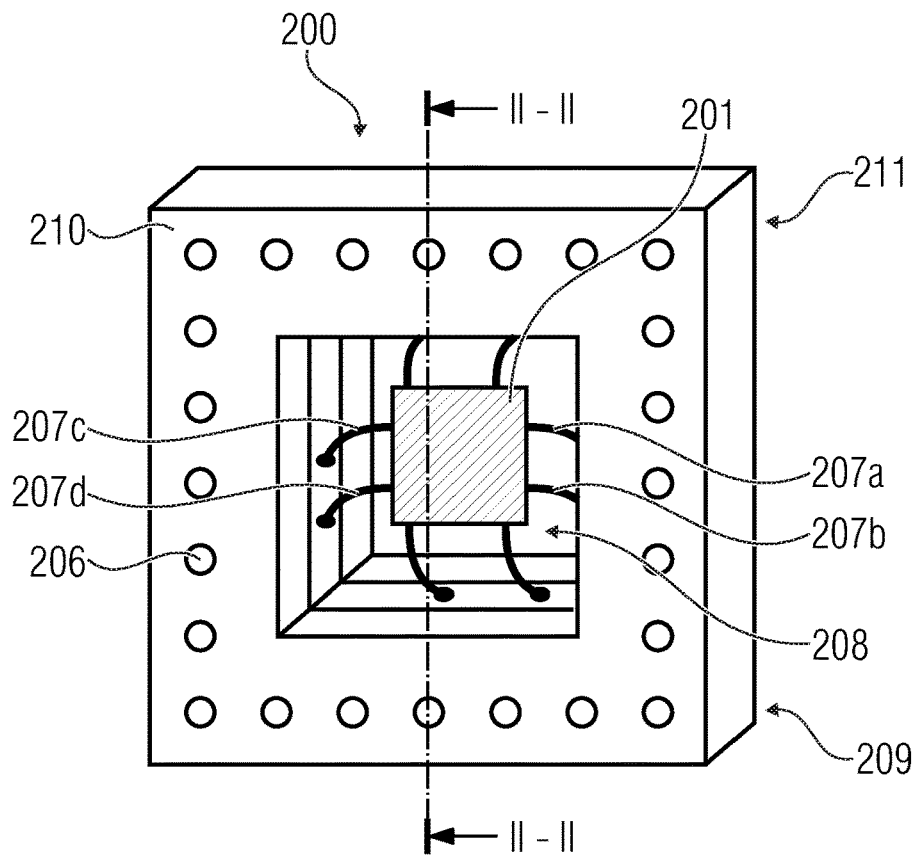
FIG. 2A shows a perspective view of a high-frequency electronic component according to an embodiment.

FIG. 2A shows a bottom perspective view of an embodiment of a high-frequency electronic component 200, wherein the compound semiconductor chip 201 is an unhoused semiconductor chip that is arranged at least partially within an open cavity 208 provided in a package carrier structure 209.

Figure 2B:
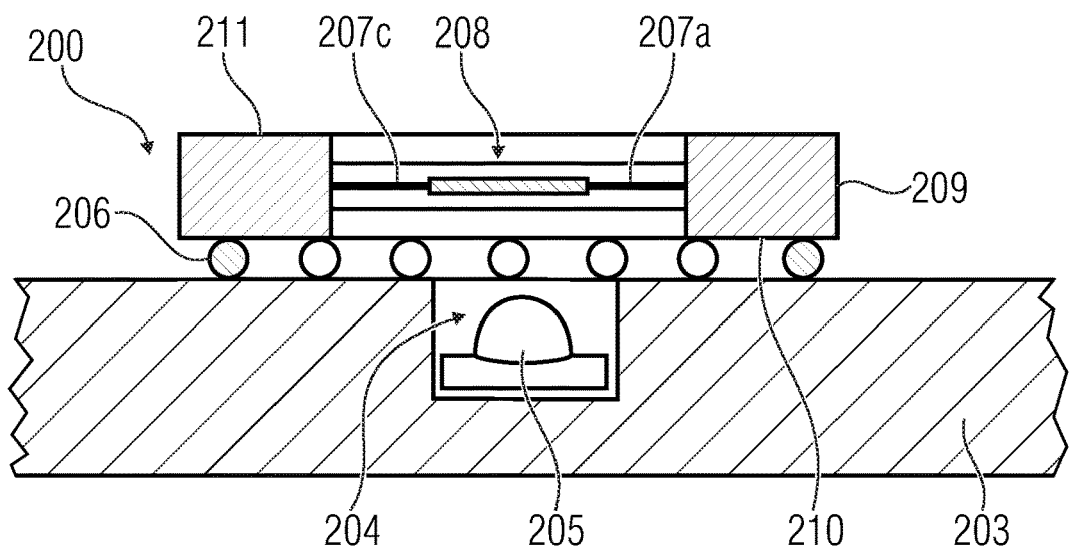
FIG. 2B shows a side cross-sectional view of the high-frequency electronic component along the cross-section line II-II shown in FIG. 2A.

The package carrier structure 209 comprises a bottom side 210 that faces towards the board 203 on which the package carrier structure 209 is to be mounted (see FIG. 2B). The package carrier structure 209 further comprises a top side 211 that faces away from the board 203.

The package carrier structure 209 is configured to carry the compound semiconductor chip 201. Thus, the package carrier structure 209 comprises a cavity 208 in which the compound semiconductor chip 201 is at least partially arranged. The cavity 208 may be provided as an opening within the package carrier structure 209. Stated differently, the bottom side 210 and the top side 211 each comprise an opening reaching through the package carrier structure 209. It may also be possible that one of the openings formed in the bottom or top sides 210, 211 may be closed. For example, the opening provided in the top side 211 may be covered with part of the package carrier structure 209 or with a separate lid, both of which may comprise a transparent window. The opening provided in the bottom side 210 may be covered with a transparent window material.

The compound semiconductor chip 201 is mechanically and electrically coupled and/or connected with the package carrier structure 209 by means of bonding wires 207a, 207b, 207c, 207d. The compound semiconductor chip 201 is spatially distanced from the walls of the cavity 208, i.e. from the inside walls of package carrier structure 209, by the bonding wires 207a-d.

FIG. 2B shows a side cross-sectional view of the package carrier structure 209 along the cross-section line II-II in FIG. 2A. As can be seen, the compound semiconductor chip 201 is approximately arranged in the middle of the cavity 208 and connected to the package carrier structure 209 by means of the bonding wires of which only bonding wires 207a and 207c are shown.

The board 203 comprises a recess 204 in which an emitting device 205 is arranged. The recess 204 is provided underneath the cavity 208 of the package carrier structure 209. More precisely, the recess 204 is provided underneath the compound semiconductor chip 201. The measures, i.e., the dimensions or circumference, of the recess 204 substantially corresponds to the measures, i.e., the dimensions or circumference, of the compound semiconductor chip 201. In other words, the recess 204 and the compound semiconductor 201 may have substantially the same size. In an alternative embodiment, the recess 204 and the cavity 208 provided in the package carrier structure 209 may have substantially the same size.

As mentioned above, the package carrier structure 209 is mounted on the board 203 by means of solder bumps 206. As shown in FIG. 2A, the solder bumps 206 are circumferentially arranged along the bottom side 210 of the package carrier structure 209. By said solder bumps 206 the package carrier structure 209 and, thus, the connected compound semiconductor chip 201 comes into mechanical and electrical contact with the board 203. Accordingly, the board 203 comprises a contact area, that may be defined by the contacting solder bumps 206, in which the compound semiconductor chip 201 is in contact with the board 203. As shown in FIG. 2B, the recess 204 in the board 203 is provided inside said contact area such that the contact area surrounds the recess 204.

Figure 3A:
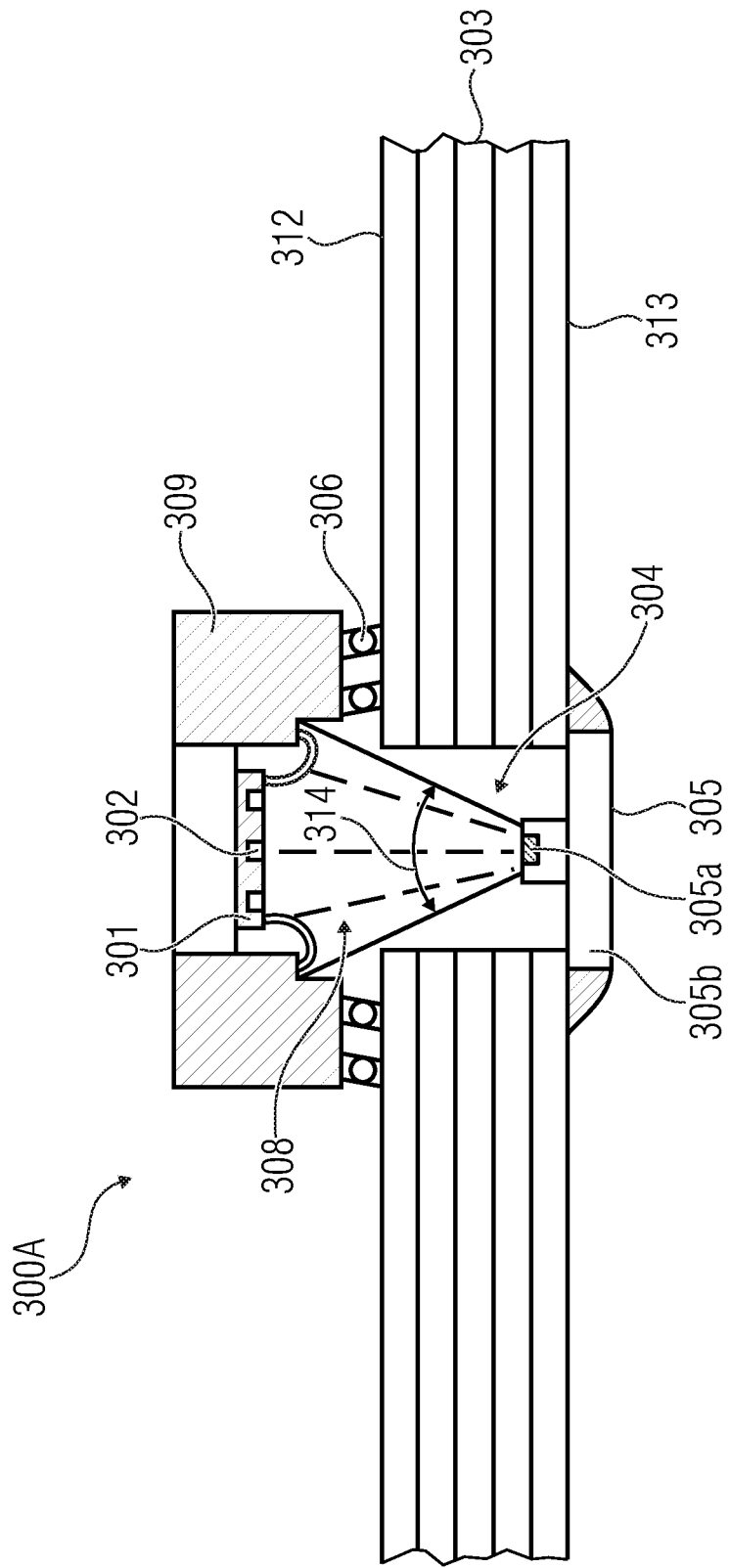
FIG. 3A shows a side cross-sectional view of a high-frequency electronic component according to further embodiment.

FIG. 3A shows a further embodiment of a high-frequency electronic component 300A according to the invention. A compound semiconductor 301 is provided in a package carrier structure 309, as described before with reference to FIGS. 2A and 2B. The package carrier structure 309, and thus the compound semiconductor 301 being provided in the package carrier structure 309, is mounted on the board 303 by means of solder bumps 306. The upper side of the board 303 on which the compound semiconductor chip 301 is mounted 303 is also referred to as a mounting side 312. The side 313 opposite the mounting side 312 is also referred to as a bottom side 313.

The recess 304 provided in the board 303 is formed as a through-hole extending through the board 303. Accordingly, the through hole 304 extends from the bottom side 312 of the board 303 to the mounting side 312 of the board 303.

An emitting device 305 is provided at the bottom side 313 of the board 303. In this embodiment, the emitting device 305 is a light emitting diode (LED), more particular a reverse-mount LED. The reverse-mount LED 305 comprises an active area 305a which is capable of emitting light, as indicated by dashed lines. The reverse-mount LED 305 further comprises an inactive area 305b that serves as a mounting portion or substrate for the active area 305a of the LED 305.

The inactive area 305b of the LED 305 comes into contact with the bottom side 313 of the board 303. The contacting surfaces of the inactive area 305b of the LED 305 and the bottom side 313 of the board 303 may be connected to each other via an adhesive or by welding, soldering, bonding or the like. The inactive area 305b of the LED 305 is arranged outside the recess or through-hole 304, while the active area 305a of the LED 305 is arranged inside the recess or through-hole 304. Accordingly, the LED 305 extends at least partially into the recess or through-hole 304.

Figure 3B:
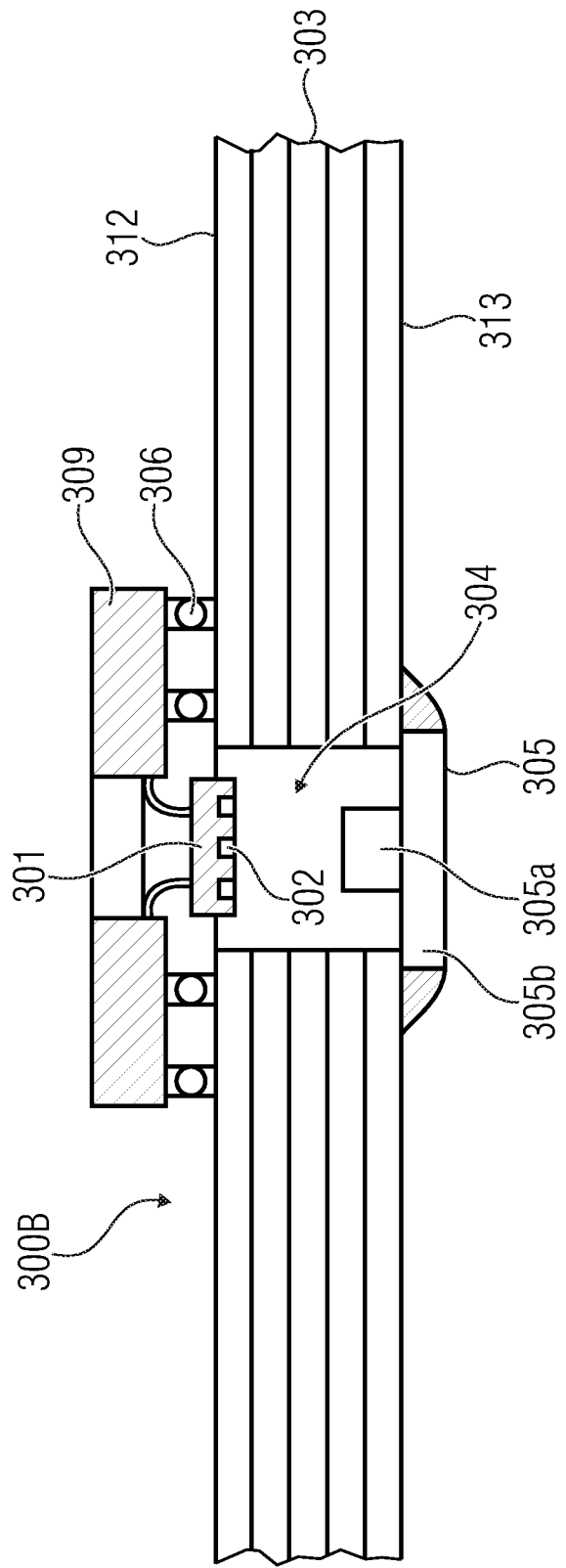
FIG. 3B shows a side cross-sectional view of a high-frequency electronic component according to further embodiment.

FIG. 3B shows a further embodiment of a high-frequency electronic component 300B according to the invention. Same elements are referenced with same numerals as in FIG. 3A. The difference to the embodiment shown in FIG. 3A is that the compound semiconductor chip 301 and the integrated circuit 302 arranged thereon are at least partially arranged inside the recess or through-hole 304.

Figure 3C:
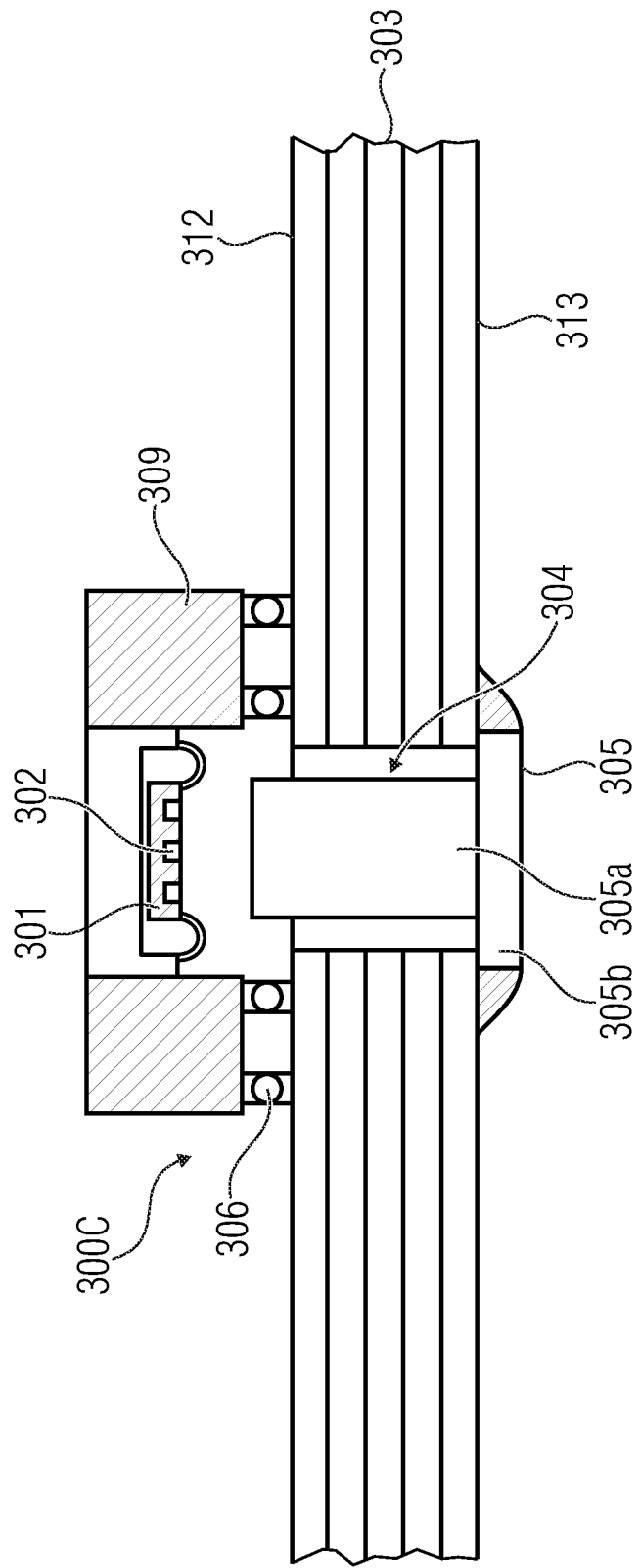
FIG. 3C shows a side cross-sectional view of a high-frequency electronic component according to further embodiment.

FIG. 3C shows a further embodiment of a high-frequency electronic component 300C according to the invention. Same elements are referenced with same numerals as in FIGS. 3A and 3B. The difference to the embodiments shown in FIGS. 3A and 3B is that the LED 305, or at least the active area 305a of the LED 305, extends through the recess or through-hole 304 from the bottom side 313 of the board 303 to the mounting side 312 of the board 303. The active area 305a protrudes from the mounting side 312 of the board 303.

Accordingly, in the embodiment shown in FIG. 3C, the integrated circuit 302 is optically coupled with the light emitting device 305. Generally speaking, the integrated circuit 302 is radiation-coupled with an emitting device 305. In the embodiments shown in FIGS. 3A and 3B, the integrated circuit 302 is optically coupled with the light emitting device 305 and the recess 304. Generally speaking, the integrated circuit 302 is radiation-coupled with the emitting device 305 and the recess 304.

As shown in FIG. 3A, the emitting device 305 comprises an irradiation angle 314 that is configured to irradiate the entire integrated circuit 302. With respect to the above described LED 305, the light emitting device 305 comprises an illumination angle 314 that is configured to illuminate the entire integrated circuit 302 arranged on the compound semiconductor chip 301. In this embodiment, the LED 305 also illuminates the entire compound semiconductor chip 301. Though not explicitly shown, the same applies to the light emitting devices 305 as shown in FIGS. 3B and 3C.

Figure 4:
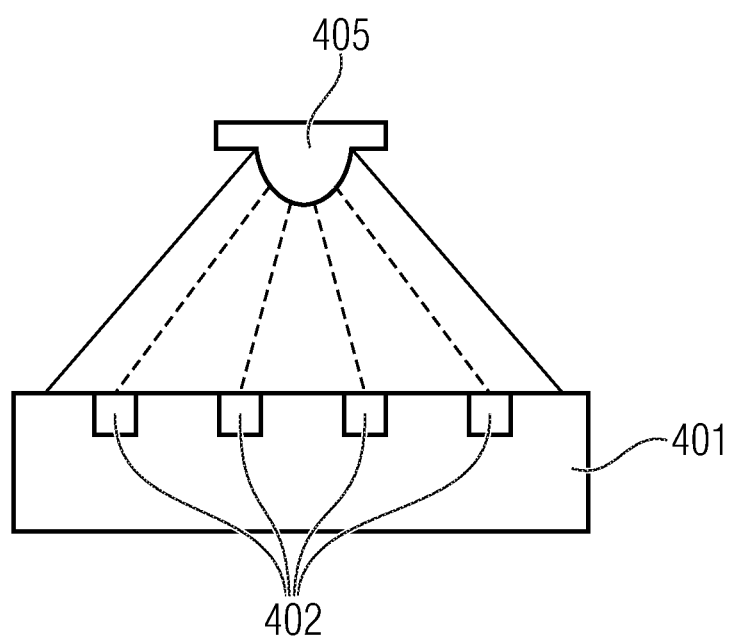
FIG. 4 shows a high-frequency integrated circuit provided on a III-V semiconductor according to an aspect of the invention.

FIG. 4 shows a further embodiment according to a second aspect of the invention, wherein a high-frequency integrated circuit 402 is provided on a III-V compound semiconductor 401. An emitting device 405 is provided that is radiation-coupled with the integrated circuit 402, indicated by dashed lines. Thus, the emitting device 405 irradiates the integrated circuit 402. The integrated circuit 402 comprises at least one of an oscillator, a frequency mixer, a frequency divider, a phase shifter or an amplifier.

In an embodiment, the high-frequency integrated circuit 402 is a Monolithic Microwave Integrated Circuit (MMIC). The III-V compound semiconductor 401 may comprise Gallium Arsenide. The emitting device 405 may be a light emitting diode (LED).

All of the embodiments shown throughout FIGS. 1 to 4 solve the problem of improving existing electronic components and integrated circuits such that large time-constant effects, for example low-frequency oscillations, are attenuated or even avoided. Experiments have been made in order to prove the technical effect of the inventive concept. The results of these experiments shall be discussed in detail in the following with reference to FIGS. 5A to 6F.

FIG. 5A shows a frequency spectrum 500A that has been recorded while operating a device according to the present invention as it has been described, for example, with reference to FIGS. 1 to 4 but with the emitting device being switched off. An RF semiconductor design has been examined that was not irradiated with an emitting device.

The emitting device has been a light emitting device, in particular a LED. As can be seen in the frequency spectrum 500A, the oscillations present occur in the frequency range of 0.5 kHz to 4 kHz. When operating the device, without irradiating it, this oscillation gets upconverted towards the RF frequency as shown in FIG. 5A. As can be seen, there is a main peak 501 at about 2.9499755 MHz. Two peaks 502, 503 of less intensity occur left and right from the main peak 501, which two lower level peaks 502, 503 represent the upconverted low-frequency oscillations.

Figure 5B:
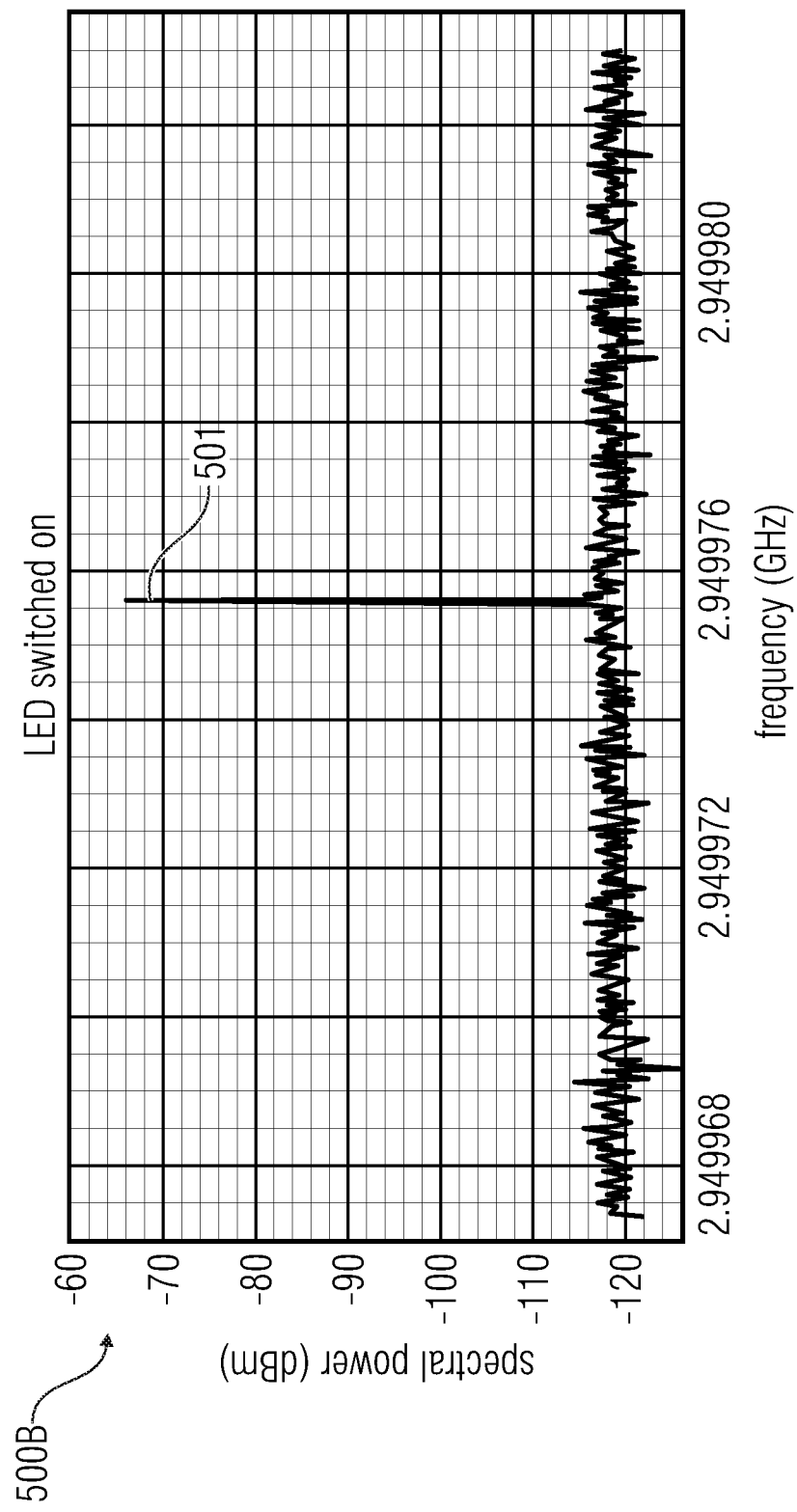
FIG. 5B shows a frequency spectrum that has been recorded during operation of an inventive device with irradiation according to the present invention.

FIG. 5B shows a frequency spectrum 500B that has been recorded while operating the same inventive device but with the emitting device, i.e. the LED, being switched on, i.e. the examined RF semiconductor has been irradiated by the emitting device. As can be seen, the upconverted low-frequency oscillations 502, 503 are no longer measurably existent. Accordingly, the large time-constant effects have been attenuated. In this case, they have even been removed from the frequency spectrum.

FIGS. 6B to 6F show further frequency spectra that have been recorded during operation of an inventive device while illuminating said device with light of different wavelengths.

Figure 6A:
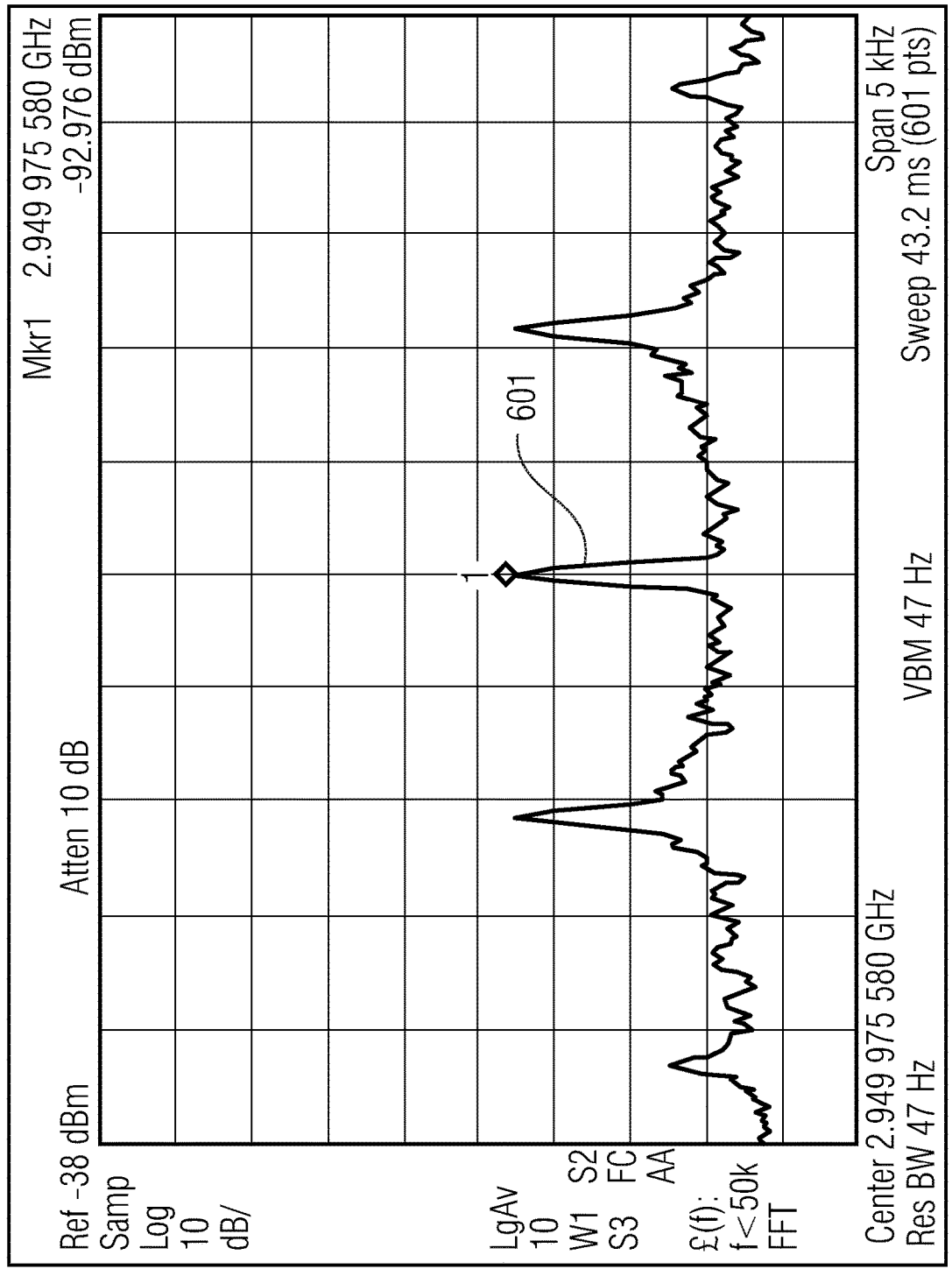
FIG. 6A shows a frequency spectrum that has been recorded during operation of an inventive device without irradiation.

FIG. 6A serves as a reference, where the examined inventive device was not illuminated by a light emitting device according to the invention. As described above with reference to FIG. 5A, the signal 601 at the marker position (marked with number '1') is the only intended one. The peaks left and right from the marked signal 601 represent undesired signals resulting from large time-constant effects.

Figure 6B:
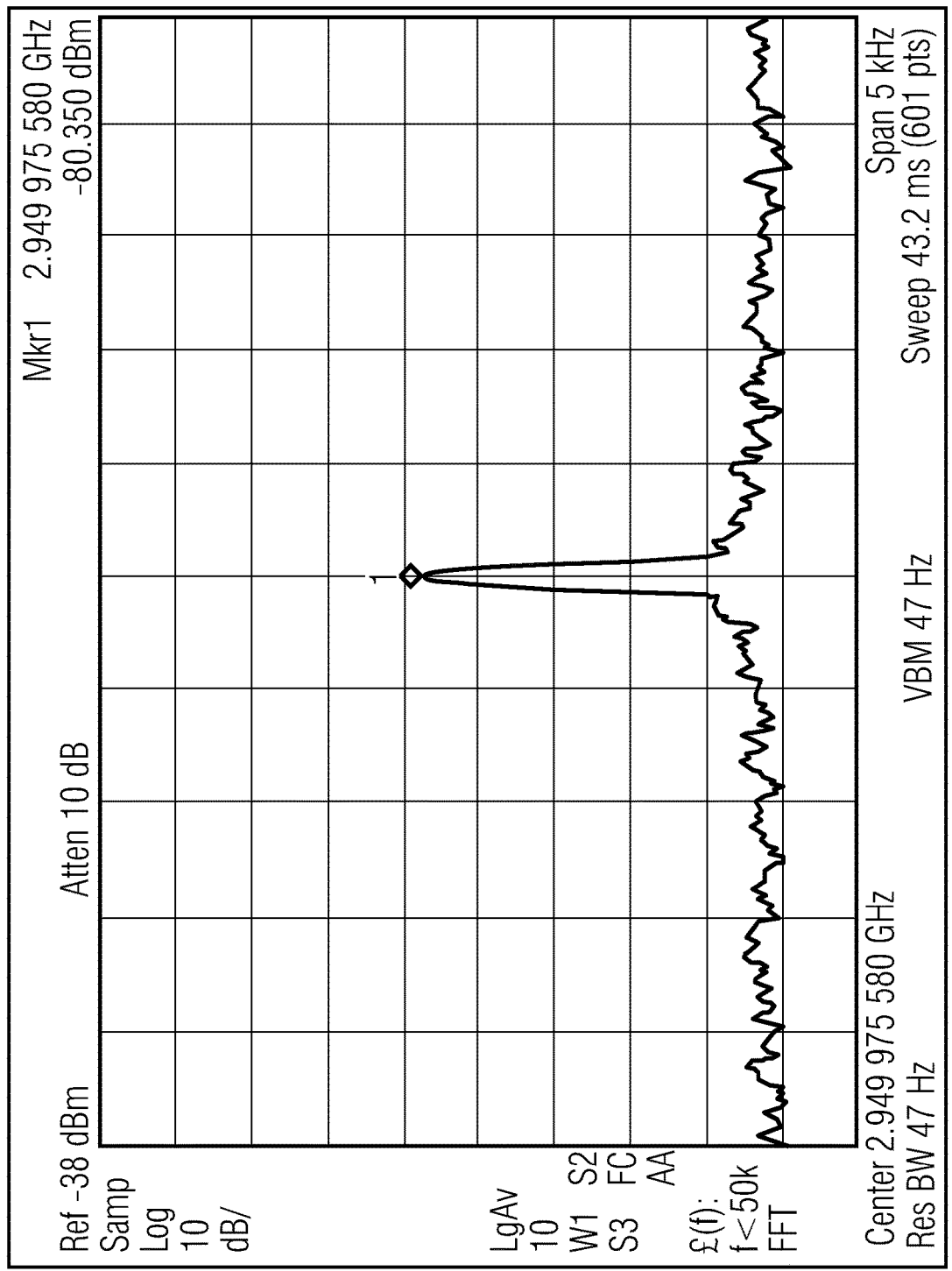
FIG. 6B shows a frequency spectrum that has been recorded during operation of an inventive device while irradiating the device with infra-red light.

FIG. 6B shows the results of an evaluation in which the inventive device was illuminated with a LED emitting infra-red light with a lambda peak of 850 nm. As can be seen, the desired signal 601 is clean and the undesired side signal peaks are removed.

Figure 6C:
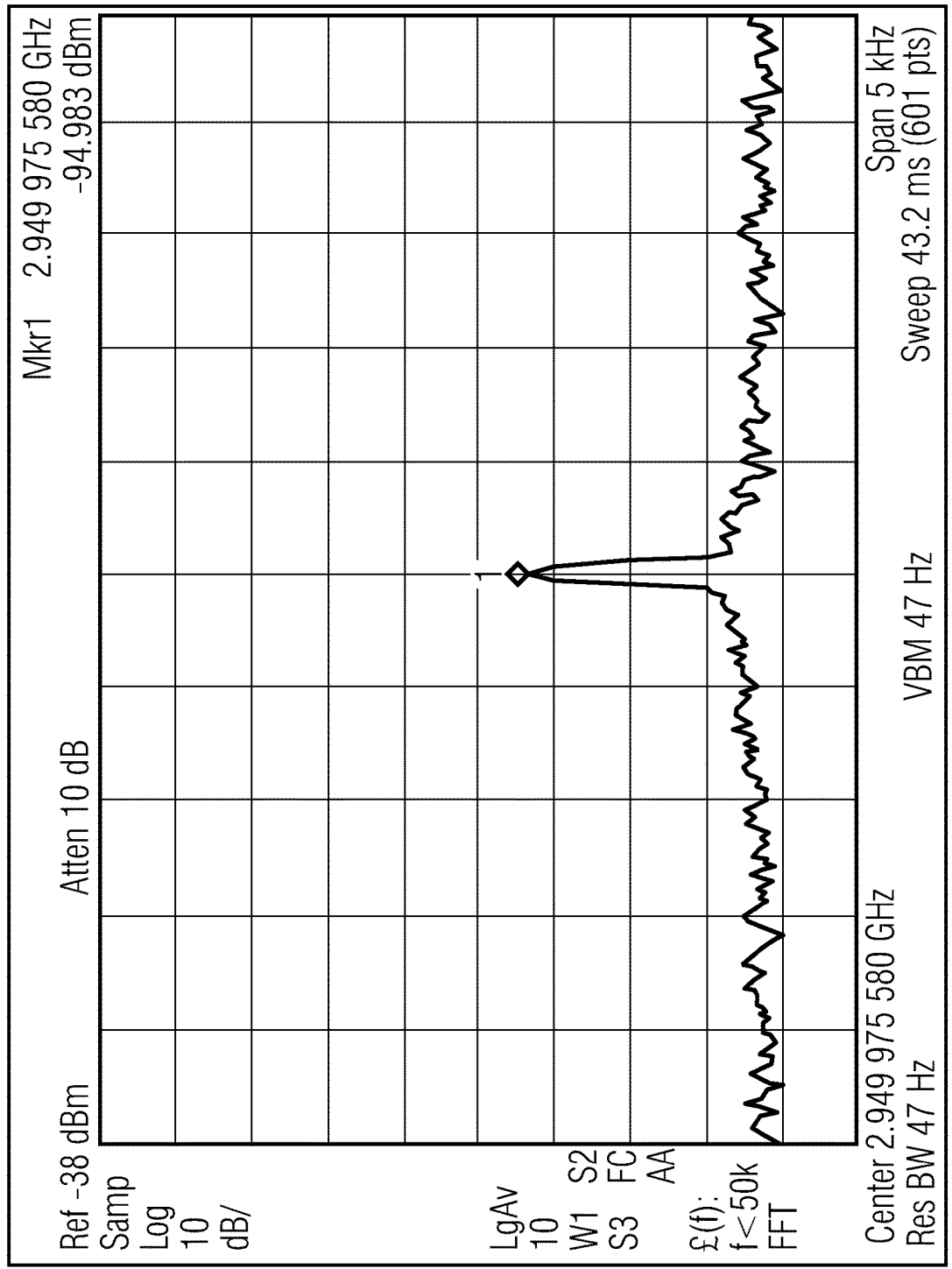
FIG. 6C shows a frequency spectrum that has been recorded during operation of an inventive device while irradiating the device with red light.

FIG. 6C shows the results of an evaluation in which the inventive device was illuminated with a LED emitting red light with a lambda peak ($\lambda_{PEAK}$) of 650 nm. As can be seen, the desired signal 601 is clean and the undesired side signal peaks are removed.

Figure 6D:
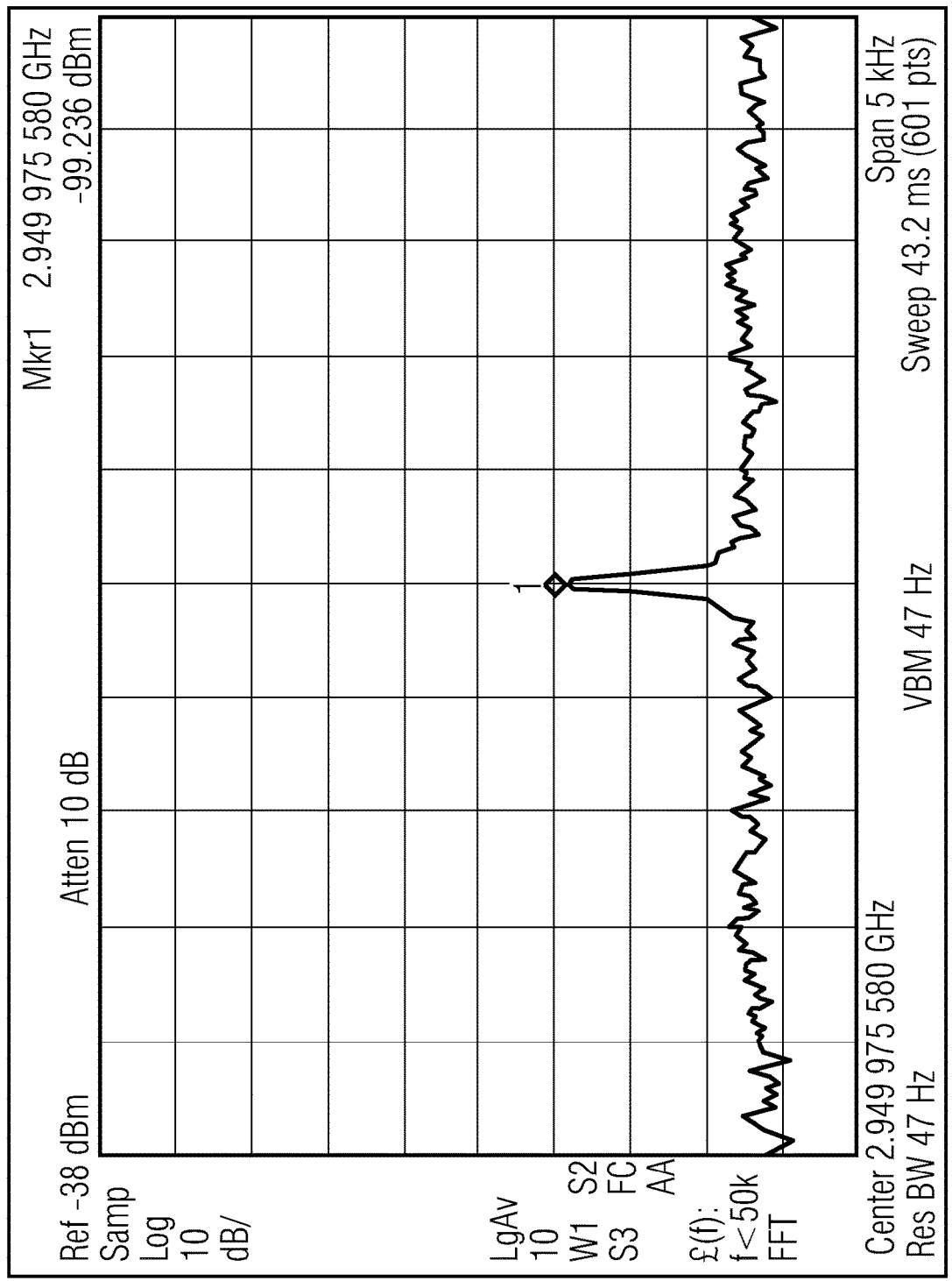
FIG. 6D shows a frequency spectrum that has been recorded during operation of an inventive device while irradiating the device with yellow light.

FIG. 6D shows the results of an evaluation in which the inventive device was illuminated with a LED emitting yellow light with a lambda peak ($\lambda_{PEAK}$) of 590 nm. As can be seen, the desired signal 601 is clean and the undesired side signal peaks are removed.

Figure 6E:
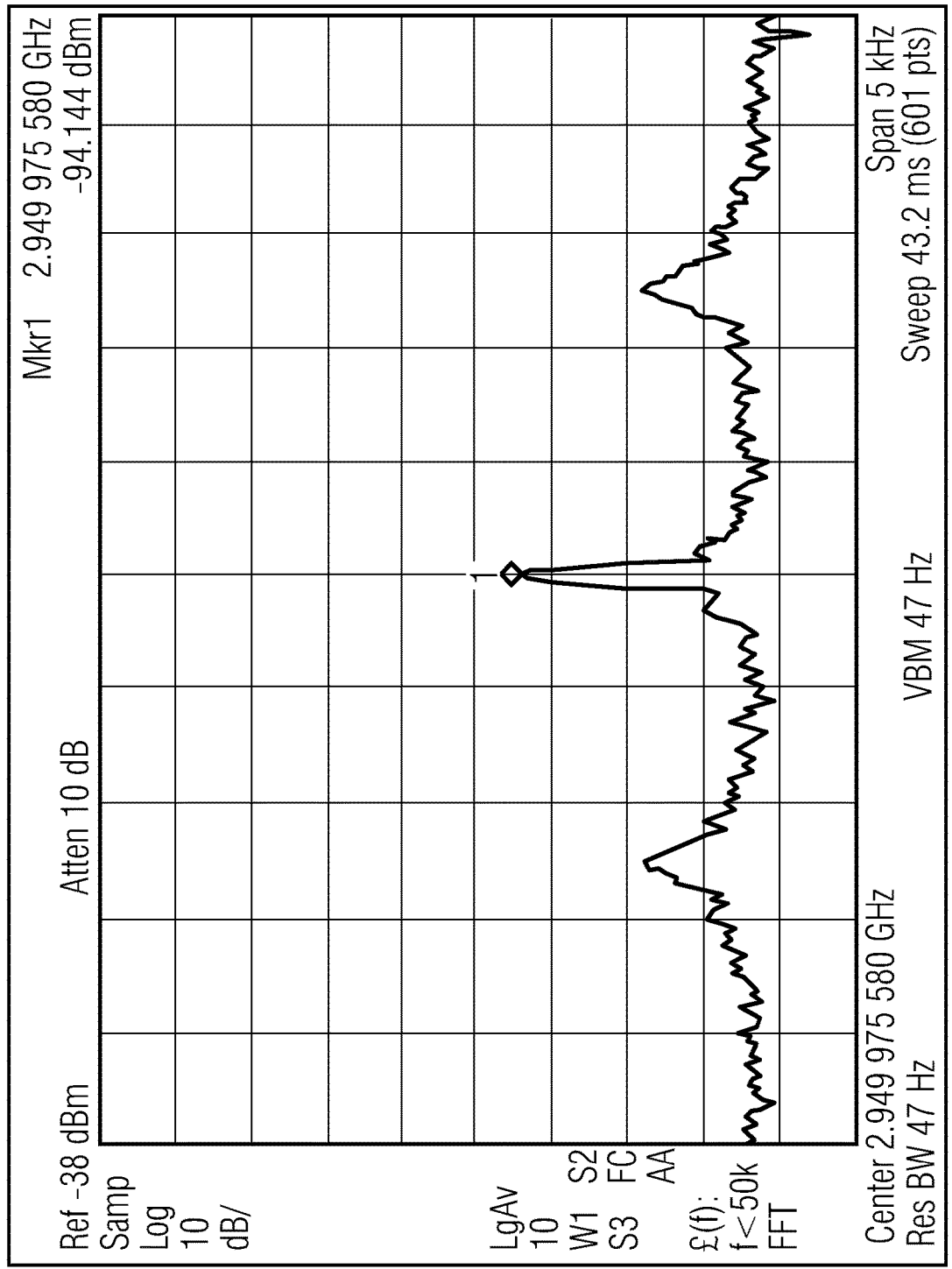
FIG. 6E shows a frequency spectrum that has been recorded during operation of an inventive device while irradiating the device with green light.

FIG. 6E shows the results of an evaluation in which the inventive device was illuminated with a LED emitting green light with a lambda peak ($\lambda_{PEAK}$) of 574 nm. As can be seen, the undesired side signal peaks are still present but they are attenuated by more than 50% compared to the spectral power in the non-illuminated reference case shown in FIG. 6A.

Figure 6F:
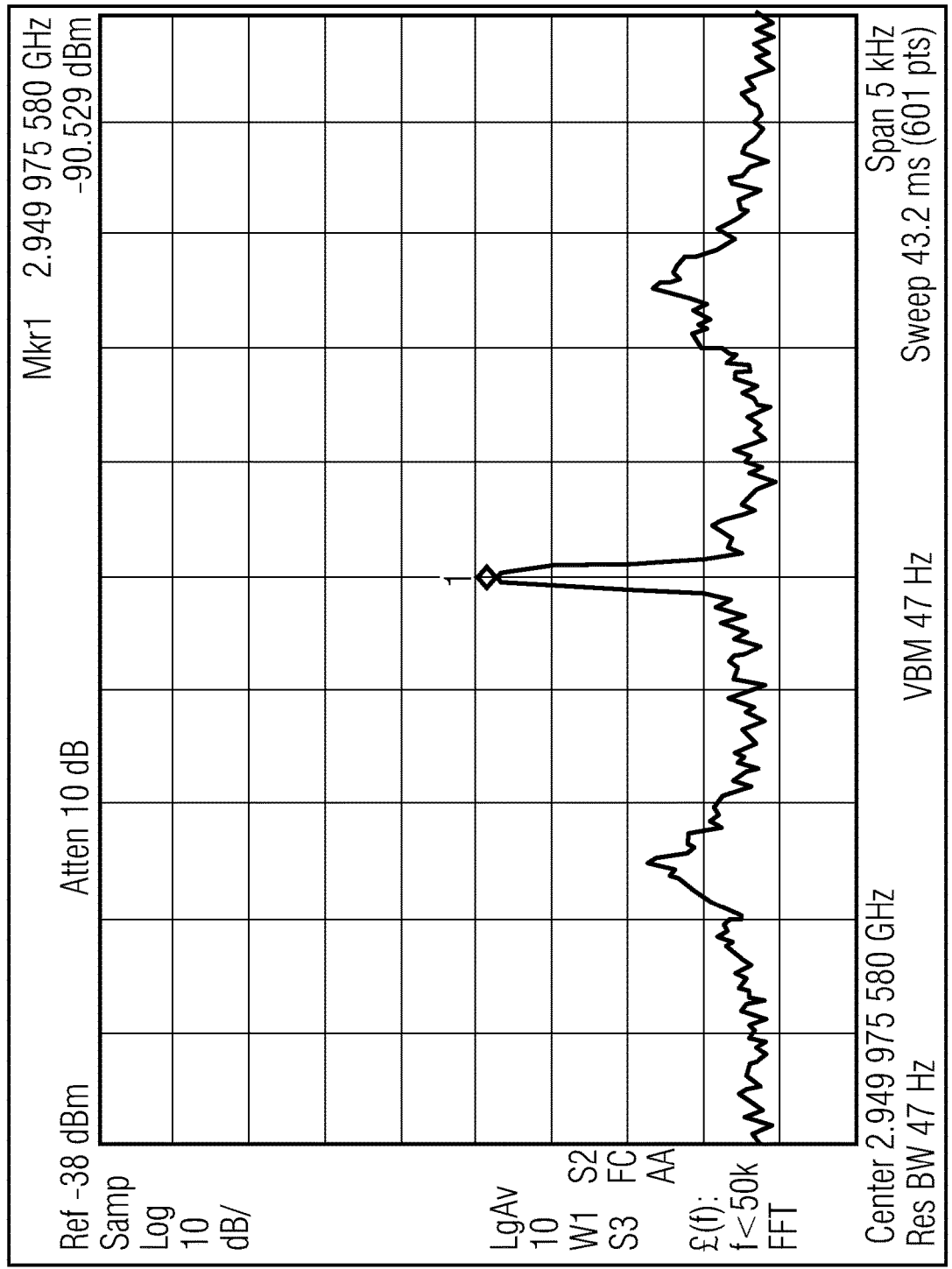
FIG. 6F shows a frequency spectrum that has been recorded during operation of an inventive device while irradiating the device with blue light.

FIG. 6F shows the results of an evaluation in which the inventive device was illuminated with a LED emitting blue light with a lambda peak ($\lambda_{PEAK}$) of 468 nm. As can be seen, the undesired side signal peaks are still present but they are attenuated by more than 50% compared to the spectral power in the non-illuminated reference case shown in FIG. 6A.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A high-frequency electronic component comprising:
a compound semiconductor chip comprising an integrated circuit; and
a board on which the compound semiconductor chip is arranged, wherein the board comprises a recess that is configured to receive an emitting device for irradiating the integrated circuit of the compound semiconductor chip, wherein the board comprises a mounting side on which the compound semiconductor chip is mounted and a side opposite the mounting side, wherein the recess comprises a through-hole extending through the board, and wherein the emitting device is arranged on the side opposite the mounting side and extends at least partially into said through-hole.

2. The high-frequency electronic component of claim 1, wherein the compound semiconductor chip comprises a III-V semiconductor.

3. The high-frequency electronic component of claim 1, wherein the compound semiconductor chip comprises Gallium Arsenide.

4. The high-frequency electronic component of claim 1, wherein the compound semiconductor chip comprises at least one of Indium Phosphide or Gallium Nitride.

5. The high-frequency electronic component of claim 1, wherein the integrated circuit is a Monolithic Microwave Integrated Circuit.

6. The high-frequency electronic component of claim 1, wherein the emitting device is configured to emit at least one of visible light, infra-red light, ultraviolet light, or gamma radiation.

7. The high-frequency electronic component of claim 1, wherein the emitting device comprises a light emitting device, which is a light emitting diode.

8. The high-frequency electronic component of claim 1, wherein the emitting device emits infra-red light at a wavelength of at least one of between 780 nm and 1400 nm, between 840 nm and 860 nm, or 850 nm.

9. The high-frequency electronic component of claim 1, wherein the emitting device emits red light at a wavelength of at least one of between 630 nm and 790 nm, between 640 nm and 660 nm, or 650 nm.

10. The high-frequency electronic component of claim 1, wherein the emitting device emits yellow light at a wavelength of at least one of between 530 nm and 630 nm between 580 nm and 600 nm, or 590 nm.

11. The high-frequency electronic component of claim 1, wherein the emitting device emits green light at a wavelength of at least one of between 480 nm and 580 nm, between 560 nm and 580 nm, or 574 nm.

12. The high-frequency electronic component of claim 1, wherein the emitting device emits blue light at a wavelength of at least one of between 380 nm and 497 nm, between 458 nm and 478 nm, or 468 nm.

13. The high-frequency electronic component of claim 1, further comprising a package carrier structure including an open cavity, wherein the compound semiconductor chip is an unhoused semiconductor chip that is arranged at least partially within the open cavity provided in the package carrier structure.

14. The high-frequency electronic component of claim 1, wherein the board comprises a contact area in which the compound semiconductor chip is in contact with the board, and wherein the recess in the board is provided inside said contact area that surrounds the recess.

15. The high-frequency electronic component of claim 1, wherein the integrated circuit is at least partially arranged inside the recess, radiation-coupled with the recess, and/or radiation-coupled with the emitting device.

16. The high-frequency electronic component of claim 1, wherein the emitting device comprises an irradiation angle that is configured to irradiate entirely the integrated circuit.

17. The high-frequency electronic component of claim 1, wherein the integrated circuit comprises at least one of a mixer, a phase shifter, a frequency divider, an oscillator, or an amplifier.

* * * * *